(12) United States Patent
Asaka et al.

(10) Patent No.: US 7,315,106 B2
(45) Date of Patent: Jan. 1, 2008

(54) ACTUATOR ELEMENT AND PRODUCTION METHOD THEREFOR

(75) Inventors: Kinji Asaka, Ikeda (JP); Takanori Fukushima, Tokyo (JP); Takuzo Aida, Tokyo (JP); Atsuko Ogawa, Yokohama (JP)

(73) Assignees: Japan Science and Technology Agency, Kawaguchi-shi (JP); National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 10/567,740

(22) PCT Filed: Dec. 3, 2004

(86) PCT No.: PCT/JP2004/018040

§ 371 (c)(1),
(2), (4) Date: Feb. 10, 2006

(87) PCT Pub. No.: WO2005/057772

PCT Pub. Date: Jun. 23, 2005

(65) Prior Publication Data

US 2006/0266981 A1    Nov. 30, 2006

(30) Foreign Application Priority Data

Dec. 8, 2003   (JP) .............................. 2003-409344

(51) Int. Cl.
*H01L 41/00* (2006.01)
*H03H 9/00* (2006.01)

(52) U.S. Cl. ...................... 310/300; 252/500; 252/502; 423/445 R; 428/300.7; 523/200; 977/725; 977/742

(58) Field of Classification Search ................ 252/500, 252/502; 310/300; 428/300.7; 523/200; 423/445 R; 977/725, 742
See application file for complete search history.

(56) References Cited

U.S. PATENT DOCUMENTS 6,555,945 B1 *   4/2003   Baughman et al. ......... 310/300
2005/0103706 A1 *   5/2005   Bennett et al. ......... 210/500.27

FOREIGN PATENT DOCUMENTS

JP         2002-353078         12/2002

(Continued)

OTHER PUBLICATIONS

Smela ("Conjugated Polymer Actuators for Biomedical Applications" Adv. Mater., Mar. 17, 2003, vol. 15, pp. 481-494□□.*

(Continued)

*Primary Examiner*—Lorna M. Douyon
*Assistant Examiner*—Tri Nguyen
(74) *Attorney, Agent, or Firm*—Westerman, Hattori, Daniels & Adrian, LLP

(57) ABSTRACT

An actuator element which functions stably in air and in vacuo, and can be driven at low voltages is described. A actuator element which includes at least two electrode layers, each of which is mutually insulated and comprises a gel composition comprising carbon nanotubes, an ionic liquid and a polymer, are formed on the surface of ion-conductive layer comprising a gel composition comprising an ionic liquid and a polymer, so that the actuator element is capable of being flexed or deformed by creating a potential difference between the electrode layers; and an actuator element wherein at least two electrode layers, each of which is mutually insulated, are formed on the surface of ion-conductive layer, conductive layer is formed on the surface of each electrode layer, and the actuator element is capable of being flexed or deformed by creating a potential difference between the conductive layers.

8 Claims, 12 Drawing Sheets

(A)

(B)

FOREIGN PATENT DOCUMENTS

| | | |
|---|---|---|
| JP | 2003-342483 | 12/2003 |
| WO | WO 02/063073 | 8/2002 |
| WO | WO 02/063073 A1 | 8/2002 |

OTHER PUBLICATIONS

Jager et al. ("Microfabricating Conjugated Polymer Actuators". Science, Nov. 24, 2000, pp. 1540-1545).*

Fukushima et al. "Molecular Ordering of Organic Molten Salts Triggered by Single-Walled Carbon Nanotubes" Science, Jun. 27, 2003, vol. 300, pp. 2072-2074.*

Ray H. Baughman et al., "Carbon Nanotube Actuators", vol. 284, May 21, 1999. pp. 1340-1344.

Wen Lu et al., "Use of Ionic Liquids for π-Conjugated Polymer Electrochemical Devices", vol. 297, Aug. 9, 2002, pp. 983-987.

Dezhi Zhou et al., "Solid State Actuators Based on Polypyrrole and Polymer-In-Ionic Liquid Electrolytes", vol. 48, May 19, 2002, pp. 2355-2359.

International Search Report, dated Feb. 8, 2005 of PCT/JP2004/0180040.

* cited by examiner (A)

(B)

ACTUATOR ELEMENT AND PRODUCTION METHOD THEREFOR

TECHNICAL FIELD

The present invention relates to an electrochemical actuator element and a production method therefor. The electrochemical actuator element herein refers to one that is driven by an electrochemical process, e.g., an electrochemical reaction, charging/discharging of electrical double layers, etc.

BACKGROUND ART

There is an increasing demand for a small, lightweight, highly flexible actuator in the fields of medical instruments, industrial and personal robots and micromachines, and the like.

When actuators are produced in small sizes, it is difficult to use motors, engines and like mechanisms that convert energy into movement by means of inertial force as power sources for such small actuators because friction and viscous forces become dominant relative to inertial forces. Therefore, electrostatic attraction, piezoelectricity, ultrasonic waves, shape memory alloys, and polymer expansion/contraction have been proposed as operational principles for small actuators.

Such small actuators, however, are problematic in that, for example, their operating environments are limited, responsivity is insufficient, structure is complex, and flexibility is wanting. The applicability of such actuators is accordingly limited.

In order to solve such problems and broaden the application of small actuators, polymer actuators have been developed that can be driven at low voltages, exhibit a prompt response, have high flexibility, can be easily made in small sizes and weight-reduced, and operate with little electricity. Such polymer actuators are roughly divided into two types, i.e., those utilizing expansion/contraction due to reduction/oxidation in an electrolyte of an electron-conductive polymer such as polypyrrole or polyaniline (electron-conductive polymer actuators), and those composed of ion-exchange membranes and electrodes disposed thereon that can function as actuators due to the flexion and deformation of ion-exchange membranes that occur in response to the application of a potential difference to the ion-exchange membranes that are in a state of containing water (ion-conductive polymer actuators).

Among such actuators, electron-conductive polymer actuators are advantageous in being able to be driven at low voltages, expand/contract to a great extent, and generate high pressure. However, their response is slow, and the only method for producing polypyrrole, which is most advantageous, is electrolytic polymerization. Moreover, it has been pointed out that their durability for repetitive use is theoretically questionable because the response is due to the doping and undoping of ions based on the redox reaction.

To overcome such problems, an actuator has been proposed in which electrodes taking the form of a paper prepared from carbon nanotubes undergo expansion/contraction due to the interfacial stress change resulting from double-layer charging/discharging (see non-patent literature 1). This actuator should have a fast response and a long lifetime considering the principle of double-layer charging/discharging. Moreover, the pressure generated by this actuator has been proved to be large. However, the extent of expansion/contraction is small, and the production method involves filtration over a long period of time, a very complex operation. In addition, this actuator has a low mechanical strength and operates only in electrolyte solutions.

Prior-art electron-conductive polymer actuators and ion-conductive polymer actuators require electrolytes for their operation, and are thus mostly used in aqueous electrolyte solutions. Ion-conductive polymer actuators do not exhibit sufficient ion conductivities unless ion-exchange resins are in the condition of being swelled by water, and thus are usually used in water. Using such actuators in air requires water evaporation to be prevented. A resin coating method has been proposed for this purpose. However, this method is not currently in practice because complete coating is difficult, the coating gets broken by even a small amount of gas generated by electrode reaction, and the coating itself serves as a resistance to response deformation. Although high-boiling-point organic solvents such as propylene carbonate can be used in place of water, such solvents pose similar problems, and are further problematic in having neither so much ion conductivity nor responsivity as water.

Hence, prior-art actuators mainly function only in restricted environments, i.e., in electrolyte solutions, and therefore, their application is very limited. Development of an actuator that can operate in air is essential for using small actuators in a broad range of applications.

There are some examples of actuators operating in air, in which an electron-conductive polymer is disposed on both sides of an ion-exchange resin, or a conductive polymer is disposed on a gel membrane containing a high-boiling-point organic solvent such as propylene carbonate, and these examples utilize the expansion and contraction of electrodes disposed on both sides of the substrate for use as actuator elements. These examples, as with ion-conductive polymer actuators, do not overcome the problem of solvent evaporation and low ion conductivity, and do not serve as fundamental solutions.

To solve such problems, applied research has recently been carried out using salts that are in a molten state within a broad temperature range including ordinary temperatures (room temperature), known as ionic liquids and called room-temperature molten salts or simply molten salts. Ionic liquids have negligible vapor pressure and are thus free from solvent evaporation.

For an electron-conductive polymer actuator to operate in air, research has been carried out on the expansion/contraction of conductive polymers in ionic liquids (non-patent literature 2), and on entirely solid-state elements using a complex of polypyrrole, an ionic liquid, and polyvinylidene fluoride (non-patent literature 3). However, the aforementioned fundamental problems resulting from conductive polymers, i.e., slow responsivity, production method, and lifetime, have not yet been solved by such research.

Non-patent literature 1: *Science,* Vol. 284, 1999, p. 1340
Non-patent literature 2: *Science,* Vol. 297, 2002, p. 983
Non-patent literature 3: *Electrochimica Acta,* Vol. 48, 2003, p. 2355

DISCLOSURE OF THE INVENTION

Problem to be Solved by the Invention

An object of the present invention is to provide an actuator element which can be driven at low voltages, which stably functions in air and in vacuo, whose production method is extremely simple, which has a long lifetime for repetitive use, which can be easily produced in a small size due to its flexibility and simple structure, which has a prompt responsivity, and which can be used in a broad range of applications.

Means for Solving the Problem

The inventors conducted extensive research and found that a novel actuator element can be obtained that can operate in air and in vacuo when a gel formed from carbon nanotubes and an ionic liquid is used as an active layer possessing conductivity and expandability/contractibility, and thereby accomplished the present invention.

In particular, the present invention provides a conductor material for an actuator element, an electrode layer for an actuator element, an ion-conductive layer for an actuator element, an actuator element, and a method for producing an actuator element.

1. A conductor material for an actuator element, the conductor material comprising a gel comprising carbon nanotubes and an ionic liquid.
2. An electrode layer for an actuator element, the electrode layer comprising a gel composition comprising carbon nanotubes, an ionic liquid and a polymer.
3. An ion-conductive layer for an actuator element, the ion-conductive layer comprising a gel composition comprising an ionic liquid and a polymer.
4. An actuator element wherein at least two electrode layers, each of which is mutually insulated and comprises a gel composition comprising carbon nanotubes, an ionic liquid and a polymer, are formed on the surface of an ion-conductive layer comprising a gel composition comprising an ionic liquid and a polymer,
the actuator element being capable of being flexed or deformed by creating a potential difference between the electrode layers.
5. A method for producing the actuator element of Item 4 comprising the step of laminating a gel composition comprising carbon nanotubes, an ionic liquid and a polymer with a gel composition comprising an ionic liquid and a polymer, by casting, coating, printing, extrusion, or injection to form electrode layers and an ion-conductive layer.
6. An actuator element wherein at least two electrode layers, each of which is mutually insulated and comprises a gel composition comprising carbon nanotubes, an ionic liquid and a polymer, are formed on the surface of an ion-conductive layer comprising a gel composition comprising an ionic liquid and a polymer, and a conductive layer is formed on the surface of each electrode layer,
the actuator element being capable of being flexed or deformed by creating a potential difference between the conductive layers.
7. A method for producing the actuator element of Item 6 comprising the step of laminating a gel composition comprising carbon nanotubes, an ionic liquid and a polymer with a gel composition comprising an ionic liquid and a polymer, by casting, coating, printing, extrusion, or injection to form electrode layers and an ion-conductive layer.

The present invention is described below in detail.

Ionic liquids usable in the present invention are salts called room-temperature molten salts or simply molten salts, and they are in a molten state within a broad temperature range including ordinary temperatures (room temperature).

Although a variety of known ionic liquids are usable in the present invention, those that are in a liquid state and stable at and around ordinary temperatures (room temperature) are preferable. Room-temperature molten salts having a conductivity of $0.1\ Sm^{-1}$ or greater are preferable in the present invention.

Examples of ionic liquids preferably used in the present invention are those containing cations (preferably imidazolium ions) represented by Formulas (I) to (IV) below and anions ($X^-$).

Formula (I)

(I)

Formula (II)

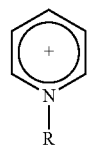

(II)

Formula (III)

(III)

Formula (IV)

(IV)

In Formulas (I) to (IV) above, R is a $C_{1-12}$ alkyl group or an ether-linkage-containing alkyl group having a total of 3 to 12 carbon and oxygen atoms. In Formula (I), $R^1$ is a $C_{1-4}$ alkyl group or a hydrogen atom. In Formula (I), R and $R^1$ are preferably not the same. In Formulas (III) and (IV), each x is an integer from 1 to 4.

At least one member selected from the following group is preferable as an anion ($X^-$): tetrafluoroboric acid anion, hexafluorophosphoric acid anion, bis(trifluoromethanesulfonyl)imidic acid anion, perchloric acid anion, tris(trifluoromethanesulfonyl)carbon acid anion, trifluoromethanesulfonic acid anion, dicyanamide anion, trifluoroacetic acid anion, organic carboxylic acid anions, and halogen ions.

Carbon nanotubes for use in the present invention are carbon materials created by the rolling of a graphene sheet to take the form of a cylinder, and they are roughly divided into single-wall nanotubes (SWNTs) and multiwall nanotubes (MWNTs) according to the wall structure. Various types of carbon nanotubes are known depending on the structure of the graphene sheet, such as chiral (spiral) nanotubes, zigzag nanotubes, armchair nanotubes, etc. Any such carbon nanotubes can be used in the present invention insofar as they are encompassed within the term carbon nanotubes. Generally, it is easy to form a gel with single-wall nanotubes with a large aspect ratio, i.e., narrow and long single-wall nanotubes. Therefore, it is advantageous for the present invention to form gel compositions from SWNTs. A preferable example of carbon nanotubes for practical use is HiPco (trade name, manufactured by Carbon Nanotechnology Incorporated), which can be produced in relatively large quantities using carbon monoxide as a starting material. Examples are not limited to HiPco, of course.

Examples of polymers usable in the present invention in preparing gel compositions are polyvinylidene fluoride/ hexafluoropropylene copolymer [PVDF(HFP)], polyvinylidene fluoride (PVDF), perfluorosulfonic acid (Nafion), poly(2-hydroxyethyl methacrylate) (PHEMA), polymethyl methacrylate (PMMA), polyethylene oxide (PEO), polyacrylonitrile (PAN), etc.

FIG. 1 shows schematic representations of the structures (cross section) of example actuator elements of the present invention. FIG. 1(A) shows a 3-layer actuator element in which ion-conductive layer 1 formed from a gel composition containing an ionic liquid and a polymer is sandwiched between electrode layers 2 and 2 formed from a gel composition containing carbon nanotubes, an ionic liquid and a polymer. Electrode layers 2 and 2 are disposed so as to be mutually insulated. FIG. 1(B) shows a 5-layer actuator element in which conductive layers 3 and 3 are further disposed on the outer sides of electrode layers 2 and 2 to increase the surface conductivity of the electrodes.

The gel composition for use in forming electrode layers 2 and 2 contains carbon nanotubes, an ionic liquid and a polymer. A carbon nanotube gel is formed from carbon nanotubes and an ionic liquid, and then a polymer is introduced to the gel to enhance mechanical strength, thereby producing the gel composition.

The gel formed from carbon nanotubes and an ionic liquid is prepared by applying shearing force to carbon nanotubes in the presence of an ionic liquid. The proportion of carbon nanotubes is preferably carbon nanotubes/gel=1-40 wt. %, and more preferably carbon nanotubes/gel=5-20 wt. %. The gel formed from carbon nanotubes and an ionic liquid is an unusual material in which carbon nanotubes are finely dispersed without losing their properties, and is nonvolatile, nonflammable, and of high thermal stability.

When preparing an electrode layer having conductivity and capable of expanding/contracting in response to electricity by introducing a polymer to the carbon nanotube gel to enhance mechanical strength, the proportion (weight-based) of carbon nanotube gel to polymer is preferably gel:polymer=1:2 to 4:1, and more preferably gel:polymer=1:1 to 2:1. When introducing a polymer, 4-methylpentan-2-one or the like may be used as a solvent.

The gel composition for use in forming ion-conductive layer 1 is composed of an ionic liquid and a polymer. The proportion (weight-based) of ionic liquid to polymer in preparing the gel composition is preferably ionic liquid:polymer=1:2 to 4:1 and more preferably ionic liquid:polymer=1:1 to 2:1. When mixing an ionic liquid with a polymer, 4-methylpentan-2-one or the like may be used as a solvent.

The preparation of an actuator element by forming electrode layers 2 and 2 on the surface of ion-conductive layer 1 may be carried out according to, for example, a method in which gel compositions for each layer are successively turned into a film by casting, evaporating off the solvents, and drying the film.

The individual thickness of ion-conductive layer 1 and the thickness of each electrode layer 2 is preferably 10 to 500 µm, and more preferably 50 to 200 µm. Gel compositions for each layer can be turned into a film by spin-coating, printing, spraying, and like methods. Extrusion, injection, etc., are also usable.

When disposing conductive layers 3, the placement of carbon nanotube papers by pressing, casting or a like method, the placement of noble metal layers by sputtering, vapor deposition or a like method, the application of carbon pastes by spraying, printing or a like method, etc., are usable. Among such methods, placement of noble metal layers by sputtering is preferable. The thickness of each conductive layer 3 is preferably 10 to 50 nm.

With respect to the actuator element thus obtained, when a direct-current voltage of 0.5 to 3 V is applied between the electrodes, a displacement of about 0.5 to about 1 times the element length can be obtained within a few seconds. Moreover, the actuator element can flexibly function in air and in vacuo.

The principle of the actuator element operation can be explained with reference to FIG. 2. When a potential difference is created at the mutually insulated electrode layers 2 and 2 disposed on the surface of ion-conductive layer 1, an electrical double layer is formed at the interface between the carbon nanotube phase and ionic liquid phase in the electrode layers 2 and 2, and the electrode layers 2 and 2 expand or contract according to the interfacial stress created by the electrical double layer. In FIG. 2, the film is flexed in the direction of the positive electrode. This is presumably because carbon nanotubes undergo greater elongation on the negative electrode side due to a quantum chemical effect, and in currently commonly used ionic liquids the ion radius of cations 4 is large, resulting in greater elongation on the negative electrode side due to steric effects. In FIG. 2, "4" indicates a cation of an ionic liquid and "5" indicates an anion of an ionic liquid.

The actuator element obtained according to the method described above can contribute to technical fields where the property of electrical expansion/contraction of carbon nanotubes can be advantageously used because the effective interfacial area of the gel formed from the carbon nanotubes and the ionic liquid is significantly large, and the impedance at the interfacial electrical double layer is hence small. Moreover, mechanically, adhesion at the interface is enhanced and the durability of the element is increased. As a result, an element that exhibits good responsivity in air and in vacuo, creates large displacement, and is durable can be obtained. Furthermore, the structure of the element is simple, and the element can be easily produced in a small size and can function with little electricity.

Since the actuator element of the present invention flexibly functions in air and in vacuo with good durability under low-voltage conditions, it is suitable as an actuator for robots that need to be safe to interactions with humans (for example, as an actuator for domestic robots, robot pets, amusement robots, and like personal robots); robots that work in special environments such as in space, in vacuum chambers, in rescuing, etc.; medical/welfare robots such as surgical elements, muscle suits; micromachines; etc.

In particular, there is an increasing demand for an actuator for specimen conveyance and positioning in material production in vacuum environments and ultra-clean environments to obtain products with high purity. The actuator element of the present invention produced using an ionic liquid that does not evaporate is of use as a contamination-free actuator for processing in vacuum environments.

While at least two electrode layers have to be disposed on the surface of an ion-conductive layer, the disposal of a number of electrode layers 2 on the surface of planar ion-conductive layer 1 as shown in FIG. 3 allows an actuator element to perform complex movements. Such an element enables conveyance by peristaltic motion and makes it possible to produce micromanipulators. The shape of the actuator element of the present invention is not limited to being planar, and the element can easily be produced in any desired shape. For example, the element shown in FIG. 4 has four electrode layers 2 disposed around rod-shaped ion-conductive layer 1 with a diameter of about 1 mm. Such an element allows the production of an actuator that can be inserted into a narrow tube.

EFFECT OF THE INVENTION

The actuator element of the present invention stably functions in air and in vacuo and can be driven at a low voltage. Furthermore, the actuator can be produced according to a simple process, exhibits a large degree of displacement with a great displacement force, can be easily produced in a small size, has a prompt response, and operates flexibly.

DESCRIPTION OF REFERENCE NUMERALS

Figure 1:
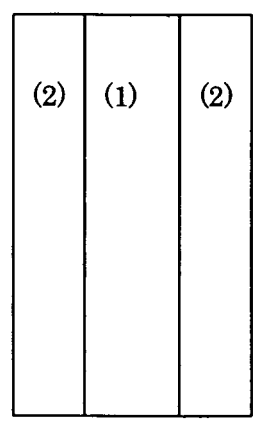
FIG. 1(A) is a schematic representation of the structure of one example of the actuator element of the present invention (3-layer structure).
FIG. 1(B) is a schematic representation of the structure of another example of the actuator element of the present invention (5-layer structure).
Figure 1:
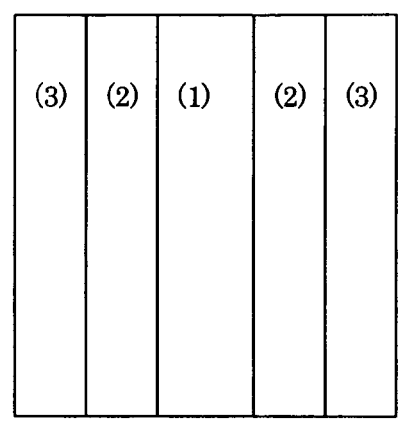
Figure 2:
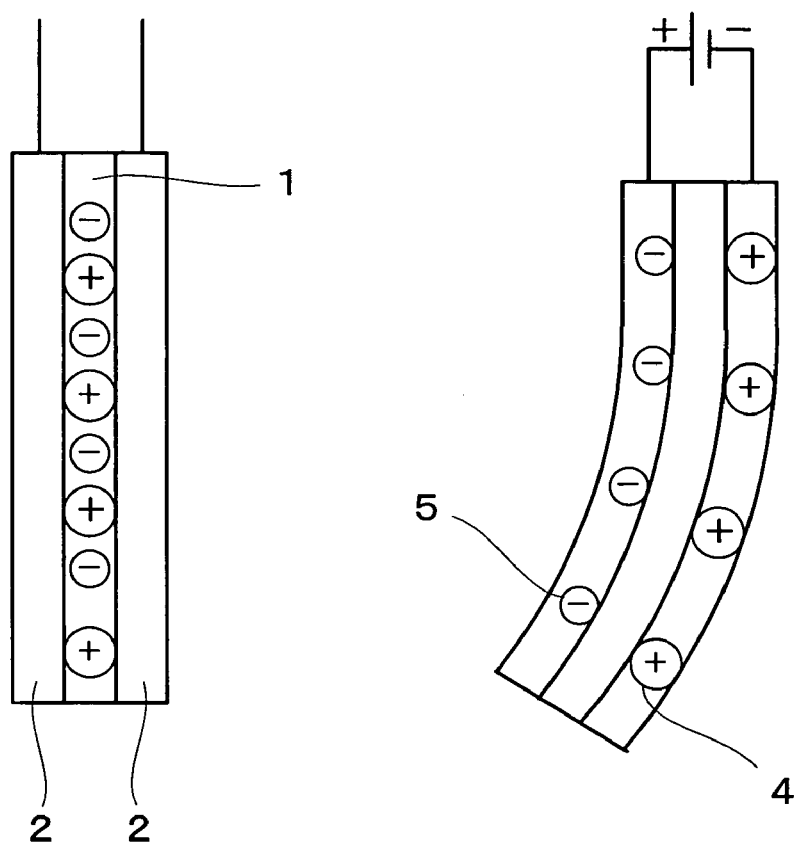
FIG. 2 shows the operational principle of the actuator element of the present invention.
Figure 3:
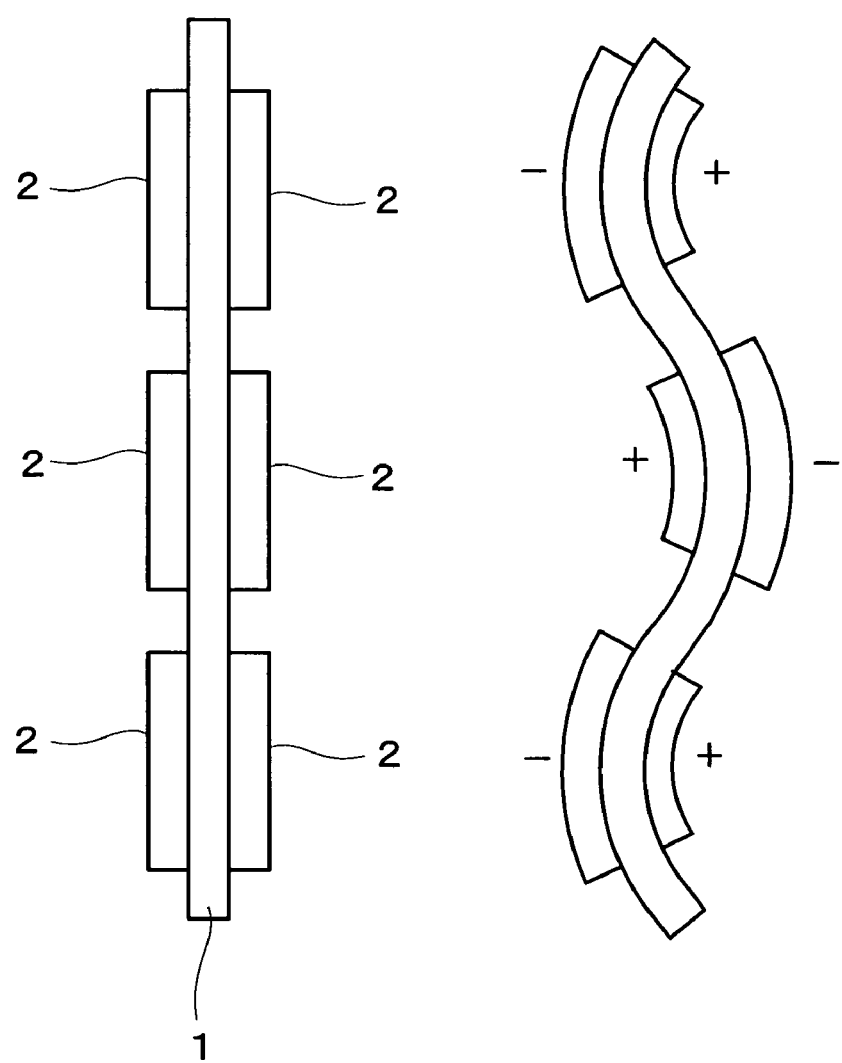
FIG. 3 is a schematic representation of another example of the actuator element of the present invention.
Figure 4:
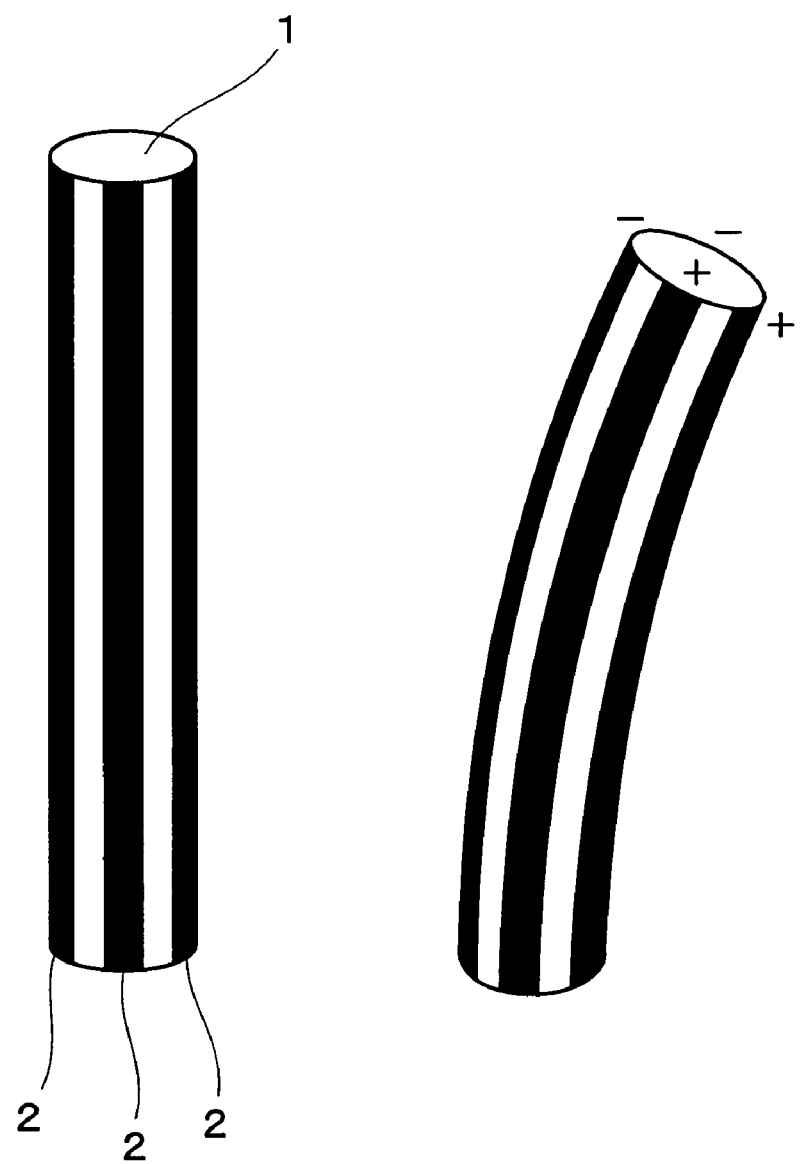
FIG. 4 is a schematic representation of another example of the actuator element of the present invention.

1. Ion-conductive layer
2. Electrode layer
3. Conductive layer
4. Ionic liquid cation
5. Ionic liquid anion

BEST MODE FOR CARRYING OUT THE INVENTION

Examples are given below to illustrate the present invention in detail.

In the Examples, a polyvinylidene fluoride/hexafluoropropylene copolymer [PVDF(HFP)] represented by the formula given below was used as a polymer.

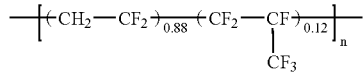

In the Examples, alkyl imidazolium salts represented by the formula given below with Me being a methyl group were used as ionic liquids, in which R is a butyl group, and anion $X^-$ is hexafluorophosphate ($PF_6^-$) (such an alkyl imidazolium salt may hereinafter be referred to as $BMIPF_6$); R is an ethyl group, and anion $X^-$ is bis(trifluoromethanesulfonyl)imide [$(CF_3SO_2)_2N^-$] (such an alkyl imidazolium salt may hereinafter be referred to as EMITFSI); and R is a butyl group, and anion $X^-$ is tetrafluoroborate ($BF_4^-$) (such an alkyl imidazolium salt may hereinafter be referred to as $BMIBF_4$).

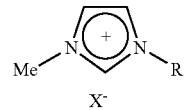

The carbon nanotubes used in the Examples were single-wall carbon nanotubes (trade name "HiPco", manufactured by Carbon Nanotechnology Incorporated) (hereinafter sometimes referred to as SWNTs).

The solvent used in the Examples was 4-methylpentan-2-one (hereinafter sometimes referred to as MP).

The carbon nanotube paper used in the Examples was prepared as follows. Single-wall carbon nanotubes were dispersed in an aqueous TritonX-100 solution with a pH of 10 (0.5 vol. %) in an ultrasonic cleaner by applying ultrasonic waves for 2 hours (0.6 mg/ml). 50 ml of the dispersion was subjected to suction-filtration using a polytetrafluoroethylene (PTFE) filter and then washed with water and methanol in a large excess. The resultant was dried naturally and removed from the filter, thereby giving a paper-like carbon nanotube paper in which self-supporting carbon nanotubes were entangled (thickness: about 50 μm). The surface resistance measured by a tester was less than several ohms over a distance of about 1 cm.

Figure 5:
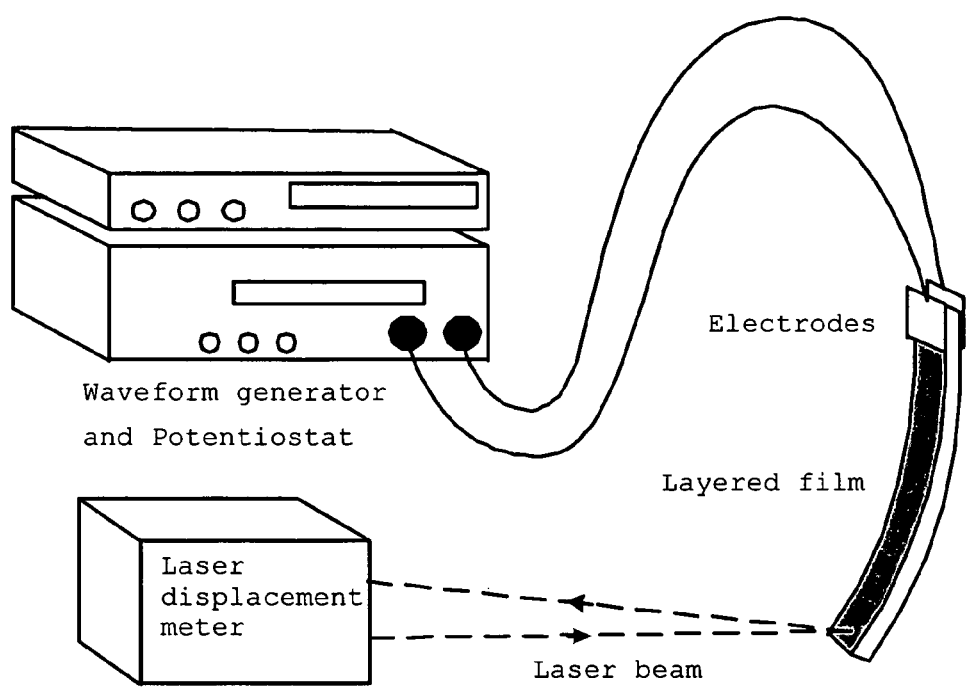
FIG. 5 is a schematic representation of a displacement measuring device.

The evaluation of responsivity was carried out by cutting the 3-layer films and 5-layer films prepared in the Examples into small pieces each having a width of 1 mm and a length of 15 mm, clipping one such piece with an electrode-equipped holder over a distance of 3 mm from the edge of a short side as shown in FIG. 5, applying in air a voltage, and measuring the displacement at 10 mm from the fixed edge using a laser displacement meter. Simultaneously, voltage and current were measured.

EXAMPLE 1

3-Layer Film Composed of a PVDF(HFP) Gel of Ionic Liquid ($BMIPF_6$) and a Carbon Nanotube Gel of the Same Ionic Liquid (1) Preparation of a Single-wall Carbon Nanotube (SWNT) and $BMIPF_6$ Gel SWNTs (28 mg) were kneaded in $BMIPF_6$ (509 mg) for 15 minutes, thereby forming a gel containing 5 wt. % SWNTs. Due to the kneading, the ionic liquid was gelated by the carbon nanotube.

(2) Preparation of a 3-Layer Gel Film in which a PVDF(HFP) Gel of an Ionic Liquid is Sandwiched Between SWNT Gels The SWNT gel prepared in (1) above (73 mg), a polymer [PVDF(HFP)] (71 mg), and MP (0.8 ml) were mixed while heating at 70 to 80° C., thereby producing a gel composition used for the first and third layers (electrode layers). A gel composition for forming the second layer (ion-conductive layer) to be sandwiched therebetween was prepared by mixing $BMIPF_6$ (70 mg), PVDF(HFP) (70 mg) and MP (0.4 ml) while heating at 70 to 80° C. The gel composition for the first layer was poured onto a substrate, leveled using a spacer as a guide, and dried for several minutes. Another spacer was stacked up, and the gel composition for the second layer was poured and then leveled. The third layer was created similarly, and the entire film precursor was naturally dried for an entire day and then vacuum-dried, thereby producing a 3-layer gel film.

(3) Evaluation of the Responsivity of the 3-Layer Film

Figure 6:
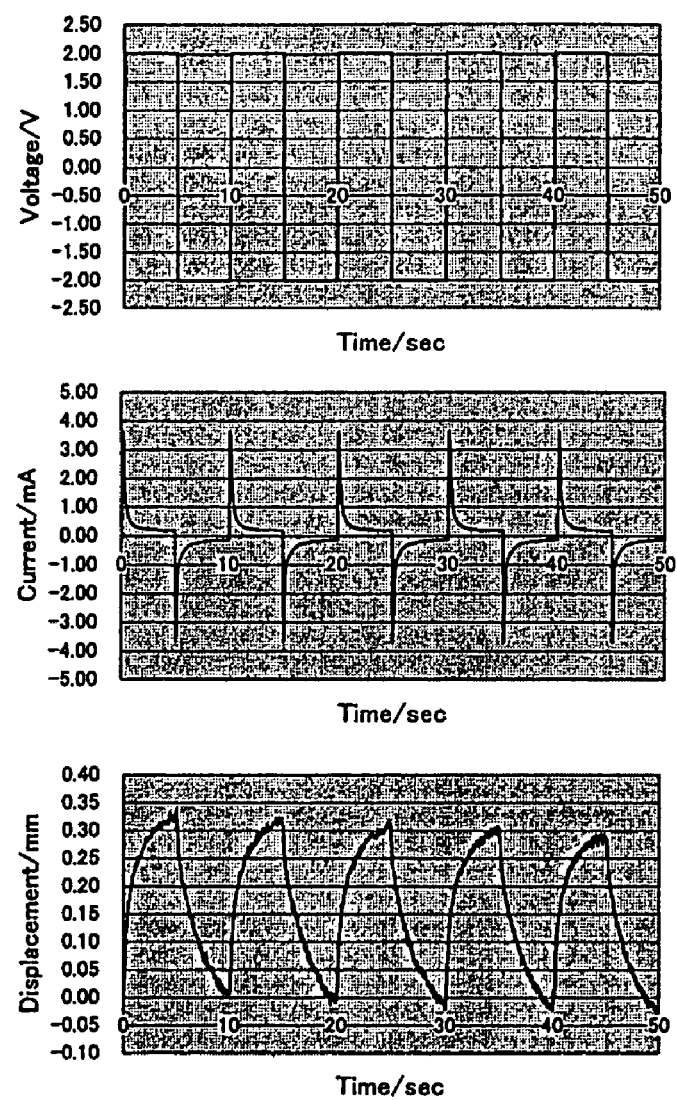
FIG. 6 is graphs showing responsivity of the 3-layer film of Example 1.
Figure 7:
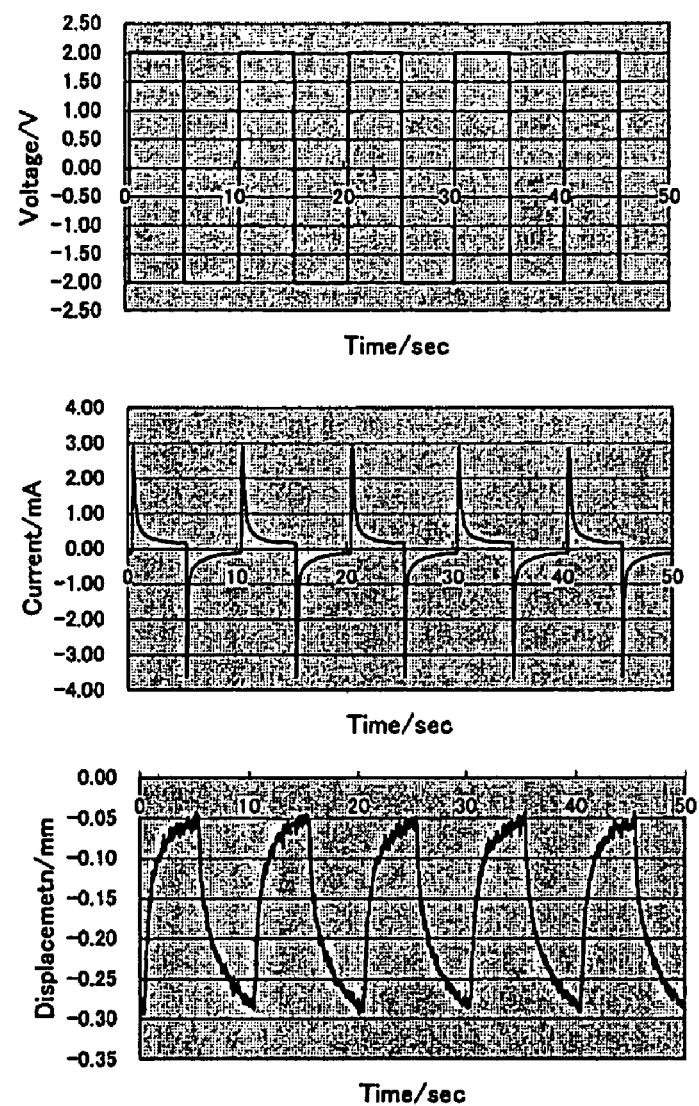
FIG. 7 is more graphs showing responsivity of the 3-layer film of Example 1.
Figure 8:
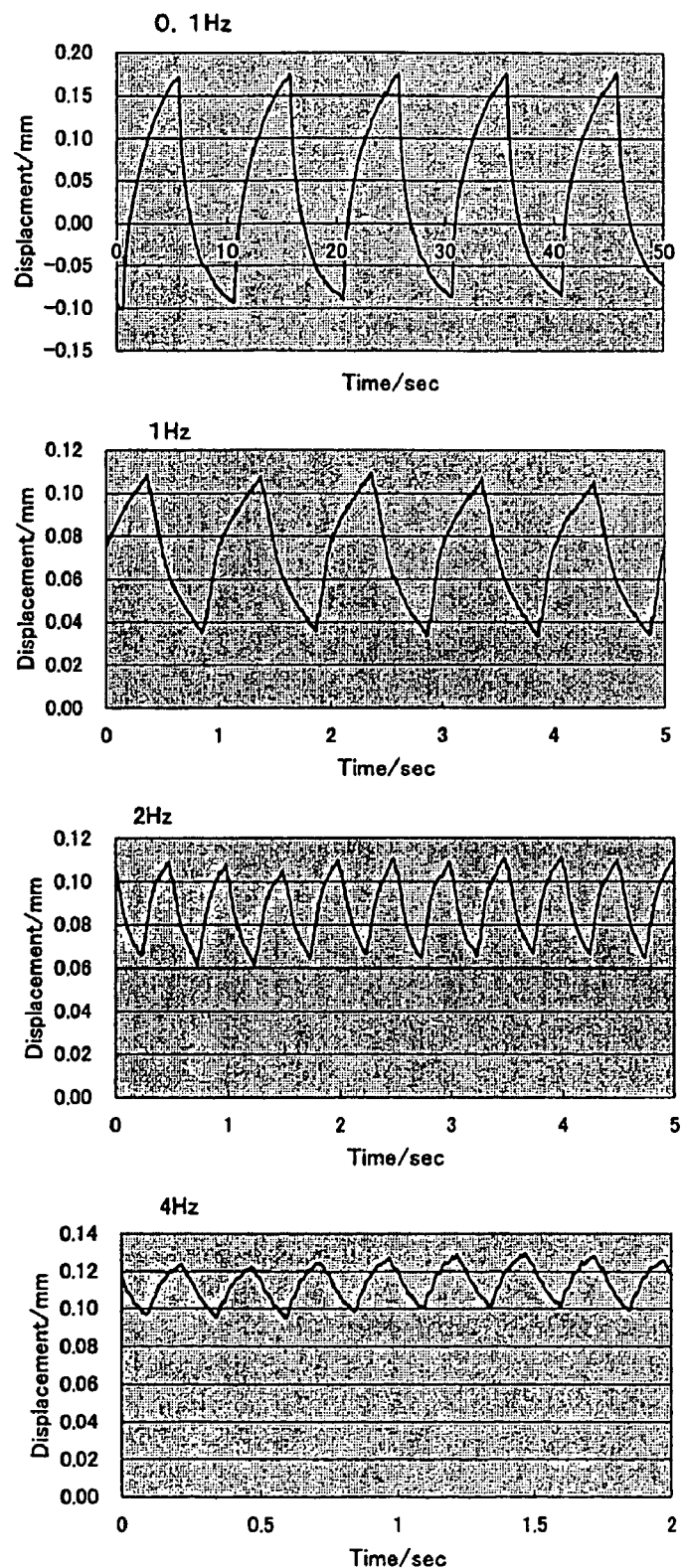
FIG. 8 is more graphs showing responsivity of the 3-layer film of Example 1.

Evaluation of responsivity was carried out according to the method described above using a laser displacement meter. FIG. 6 contains graphs showing, from the top, voltage, current, and displacement, respectively, immediately after applying a square-wave voltage with 0.1 Hz and 4 Vp.-p. The vertical axes indicate, from the top, voltage/V, current/mA, and displacement/mm. The horizontal axes indicate time/sec. The only current flowing was the charging current for the condenser. As can be understood from the graph showing displacement, the 3-layer film was flexed in the direction of the positive electrode when a voltage was applied. FIG. 7 is similar to FIG. 6 but shows the response after 30 minutes of continuous voltage application. It shows little change in response. Considering the fact that actuators in which ion-exchange resins are used lose responsivity when left to stand for no longer than 30 minutes due to water evaporation, this little change in response is presumably due to the non-evaporative nature of the ionic liquid. With respect to the lifetime, continuous operation for more than about 9000 cycles did not cause deterioration. FIG. 8 shows the displacement responses when the frequency of the 4 Vp.-p. square-wave voltage was changed. The graphs show, from the top, of 0.1 Hz, 1 Hz, 2 Hz, and 4 Hz, respectively. As can be understood from the graphs, the film can respond up to about several dozen Hz.

Table 1 shows the intensities of 0.1 Hz square-wave voltages applied (peak to peak) and the corresponding response displacements (peak to peak).

TABLE 1

|  | Voltage (V) | | |
| --- | --- | --- | --- |
|  | 3 | 4 | 5 |
| Displacement (mm) | 0.33 | 0.41 | 0.54 |

EXAMPLE 2

5-Layer Film Prepared by Furnishing, with a Carbon Nanotube Paper by Pressing, a 3-Layer Film Composed of a PVDF(HFP) Gel of an Ionic Liquid (EMITFSI) and a Carbon Nanotube Gel of the Same Ionic Liquid (1) Preparation of a Single-wall Carbon Nanotube (SWNT) and EMITFSI Gel SWNTs (21 mg) were kneaded in EMITFSI (86 mg) for 15 minutes, thereby forming a gel containing 20 wt. % SWNTs.

(2) Preparation of a 3-Layer Gel Film in Which a PVDF (HFP) Gel of an Ionic Liquid is Sandwiched Between SWNT Gels A 3-layer gel film was prepared in the same manner as in Example 1. For the first and third layers (electrode layers), the SWNT gel prepared in (1) above (105 mg), a polymer [PVDF(HFP)] (54 mg), and MP (1.0 ml) were used. For the second layer (ion-conductive layer) to be sandwiched therebetween, EMITFSI (160 mg), PVDF(HFP) (80 mg), and MP (0.7 ml) were mixed.

(3) Preparation of a 5-Layer Film

Each side of the 3-layer gel film prepared in (2) above was furnished with a carbon nanotube paper (conductive layers) by pressing.

(4) Evaluation of the Responsivity of the 5-Layer Film

Figure 9:
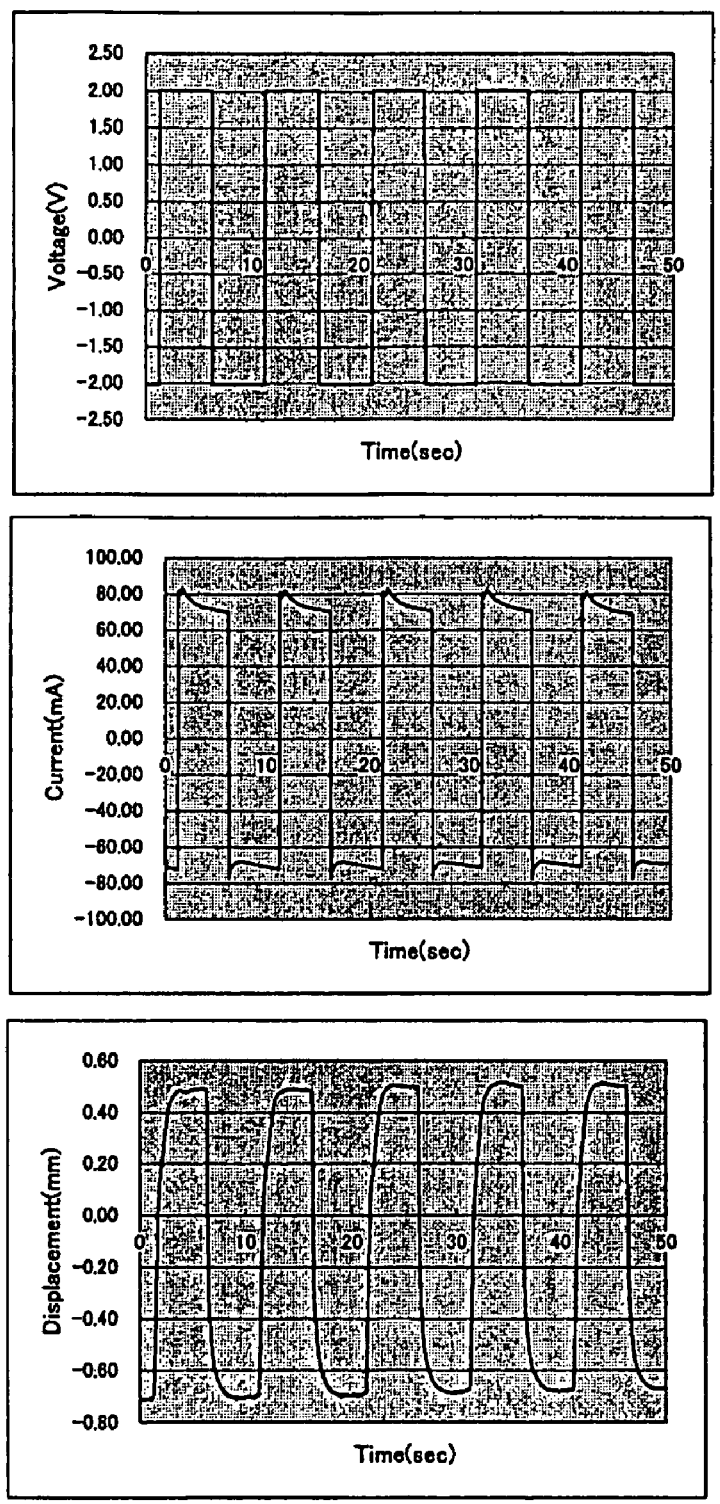
FIG. 9 is graphs showing responsivity of the 5-layer film of Example 2.
Figure 10:
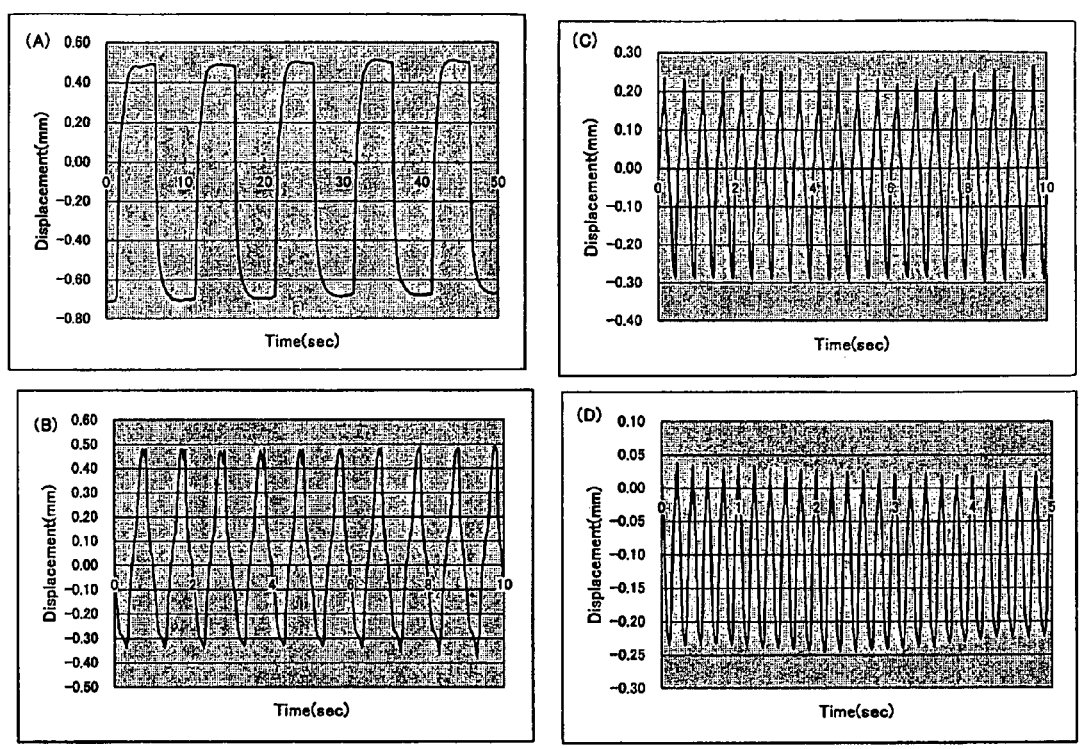
FIG. 10 is more graphs showing responsivity of the 5-layer film of Example 2.

Evaluation of responsivity was carried out as in Example 1. FIG. 9 contains graphs showing, from the top, voltage, current, and displacement, respectively, when a square-wave voltage with 0.1 Hz and 4 Vp.-p. was applied. Although the response is similar to that obtained in Example 1, the current and displacement were markedly greater than those in Example 1. This is presumably due to the large conductivity of the carbon nanotube paper. FIG. 10 shows the displacement responses when the frequency of the 4 Vp.-p. square-wave voltage was changed. The graph (A) at the upper left is for 0.1 Hz, the graph (B) at the lower left is for 1 Hz, the graph (C) at the upper right is for 2 Hz, and the graph (D) at the lower right is for 5 Hz. It can be understood from the graphs that the responsivity is much better than that of the film of Example 1.

Table 2 shows the intensities of the 0.1 Hz square-wave voltages applied (peak to peak) and the corresponding response displacements (peak to peak).

TABLE 2

|  | Voltage (V) | | | |
| --- | --- | --- | --- | --- |
|  | 2 | 3 | 4 | 5 |
| Displacement (mm) | 0.63 | 0.78 | 1.20 | 1.50 |

EXAMPLE 3

5-Layer Film Prepared by Casting (1) Preparation of a Single-Wall Carbon Nanotube (SWNT) and Ionic Liquid (BMIBF$_4$) Gel SWNTs (41 mg) were kneaded in BMIBF$_4$ (164 mg) for 15 minutes, thereby forming a gel containing 20 wt. % SWNTs.

(2) Preparation of a Film by Casting

The following ingredients were subjected to film formation by casting using a carbon nanotube paper as conductive layers 3 and 3.

First and fifth layers (conductive layers): carbon nanotube paper Second and fourth layers (electrode layers): SWNT gel prepared in (1) above (129 mg), polymer [PVDF(HFP)] (65 mg), and MP (1.5 ml) Third layer (ion-conductive layer): BMIBF$_4$ (149 mg), polymer [PVDF(HFP)] (75 mg), and MP (0.7 ml)

The resulting material was air-dried and then vacuum-dried to remove the solvent, thereby producing a 5-layer film.

(3) Evaluation of the Responsivity and Lifetime of the 5-Layer Film

Figure 11:
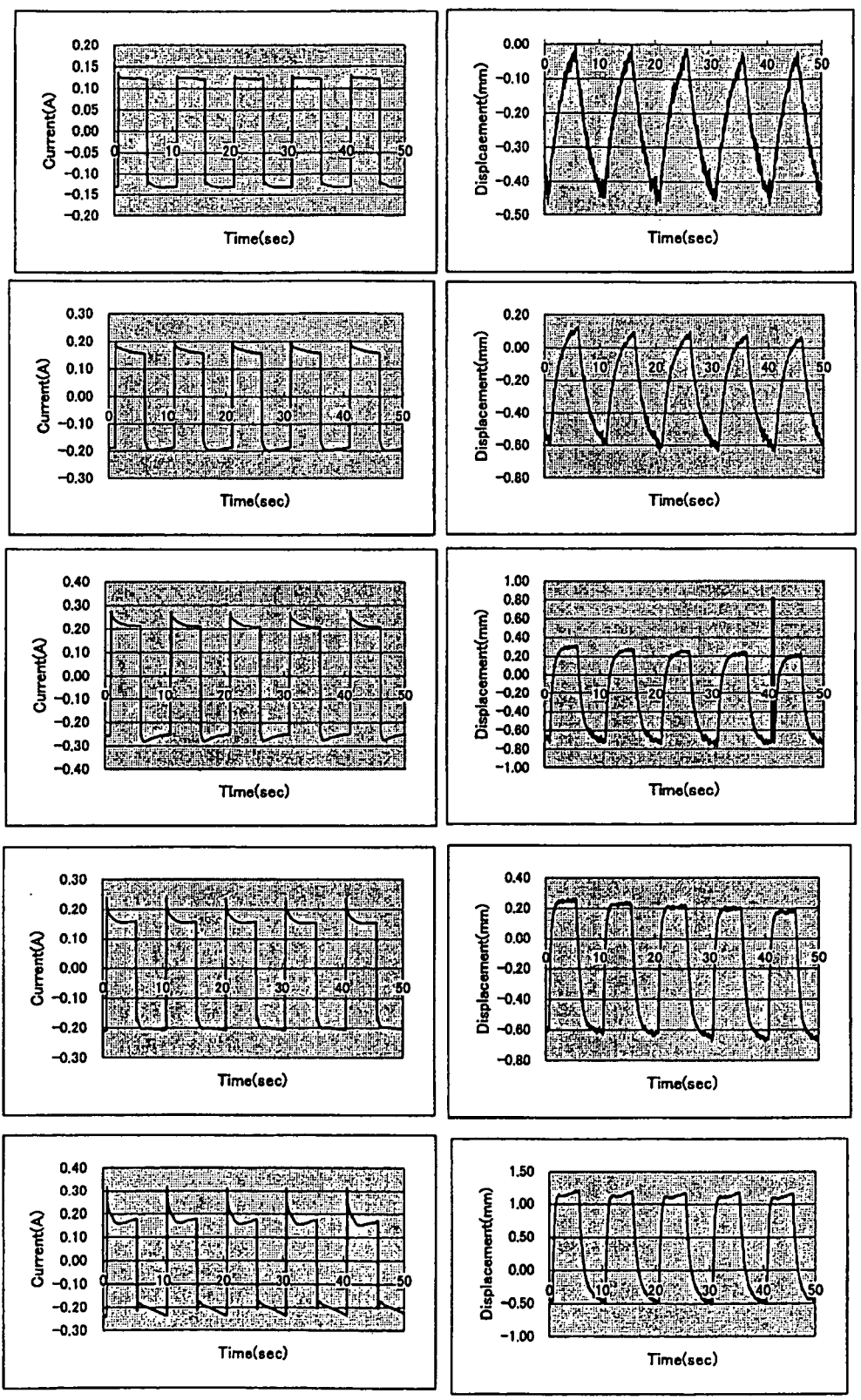
FIG. 11 is graphs showing responsivity of the 5-layer film of Example 3.

Evaluation of responsivity was carried out as in Example 1. In FIG. 11, the left column is for current and the right column is for the displacement obtained in response to 0.1

Figure 12:
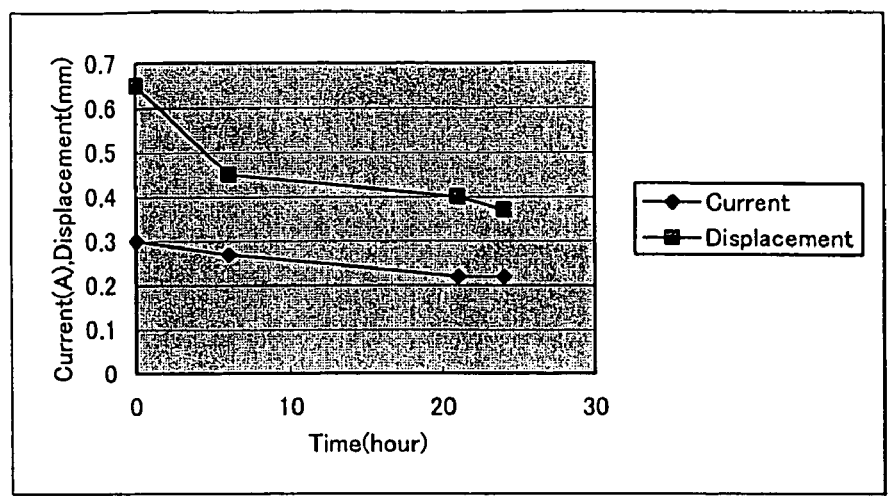
FIG. 12 is a graph showing the change over time of the responsivity of the 5-layer film of Example 3.

Hz square-wave voltages. FIG. 11 shows, from the top, the response to a square-wave voltage with 2 Vp.-p.; the response to a square-wave voltage with 3 Vp.-p.; the response to a square-wave voltage with 4 Vp.-p.; the response to a square-wave voltage with 5 Vp.-p.; and the response to a square-wave voltage with 6 Vp.-p., respectively. As can be understood, the presence of the conductive layers lowered resistance, resulting in good response characteristics. FIG. 12 shows the result of a lifetime measurement in which a square-wave voltage with 0.1 Hz and 4 Vp.-p. was continuously applied for 24 hours. In FIG. 12, peak-to-peak values of the current and the displacement obtained when a voltage was applied are plotted in relation to the time since the application of voltage. The figure shows that although the current decreased a little, it did not change much. The displacement decreased to a great extent for the first few hours, but the extent of decrease was less thereafter. Considering this figure, the film obtained in this Example is also considered to have a lifetime sufficient for use for more than 24 hours (over 9000 cycles). As described above, the film obtained in this Example has about the same responsivity compared with the film of Example 2 which was furnished with a carbon nanotube paper by pressing, but the lifetime of the film obtained in this Example is far superior.

Table 3 shows the intensities of the 0.1 Hz square-wave voltages applied (peak to peak) and the corresponding response displacements (peak to peak).

TABLE 3

|  | Voltage (V) | | | | |
| --- | --- | --- | --- | --- | --- |
|  | 2 | 3 | 4 | 5 | 6 |
| Displacement (mm) | 0.43 | 0.70 | 0.99 | 1.25 | 1.60 |

EXAMPLE 4

(3-Layer Film Prepared by Casting (Sample A);
5-Layer Film Prepared by Furnishing a 3-Layer
Film with Conductive Layers According to Gold
Sputtering (Sample B); 5-Layer Film Prepared by
Applying a Carbon Paste to a 3-Layer Film to Create Conductive Layers (Sample C)

Sample A: 3-Layer Film Prepared by Casting (1) Preparation of a Single-wall Carbon Nanotube (SWNT) and Ionic Liquid ($BMIBF_4$) Gel SWNTs (63 mg) were kneaded in $BMIBF_4$ (245 mg) for 15 minutes, thereby forming a gel containing 21 wt. % SWNTs.

(2) Formation of a Film by Casting

A film was formed by casting using the following ingredients.

First and third layers (electrode layers): SWNT gel prepared in (1) above (160 mg), polymer [PVDF(HFP)] (80 mg), and MP (1.5 ml) Second layer (ion-conductive layer): $BMIBF_4$ (163 mg), polymer [PVDF(HFP)] (82 mg), and MP (0.6 ml)

The resulting material was air-dried and then vacuum-dried to remove the solvent, thereby producing a 3-layer gel film.

Sample B: 5-Layer Film Prepared by Furnishing a 3-Layer Film with Gold Conductive Layers by Sputtering (1) Preparation of a Single-wall Carbon Nanotube (SWNT) and Ionic Liquid (BMITFSI) Gel SWNTs (65 mg) were kneaded in EMITFSI (246 mg) for 15 minutes, thereby forming a gel containing 21 wt. % SWNTs.

(2) Formation of a Film by Casting

A film was formed by casting using the following ingredients.

First and third layers (electrode layers): SWNT gel prepared in (1) above (163 mg), Polymer [PVDF(HFP)] (82 mg), and MP (1.2 ml) Second layer (ion-conductive layer): EMITFSI (161 mg), polymer [PVDF(HFP)] (80 mg), and MP (0.6 ml)

The resulting material was air-dried and then vacuum-dried to remove the solvent, thereby producing a 3-layer gel film.

(3) Preparation of a 5-Layer Film

Gold was applied to each side of the 3-layer film prepared in (2) above by sputtering to form conductive layers (using a sputtering machine for producing scanning electron microscope samples, 20 mA for 20 minutes for each side).

Sample C: 5-Layer Film Prepared by Applying a Carbon Paste to a 3-Layer Film to Create Conductive Layers (1) Preparation of a 5-Layer Film A carbon paste (trade name "Dotite XC-32", manufactured by Fujikura Kasei Co., Ltd.) diluted with toluene was sprayed onto each side of the Sample A 3-layer gel film and then dried to provide conductive layers.

Table 4 shows the intensities of 0.1 Hz square-wave voltages applied to Samples A, B and C prepared above (peak to peak) and the corresponding response displacements thereof (peak to peak).

TABLE 4

|  |  | Voltage (V) | | | | |
| --- | --- | --- | --- | --- | --- | --- |
|  |  | 2 | 3 | 4 | 5 | 6 |
| Displacement (mm) | A | 0.17 | 0.32 | 0.63 | 1.00 | 1.10 |
|  | B | 0.46 | 0.78 | 1.18 | 1.81 | 2.12 |
|  | C | 0.30 | 0.50 | 0.95 | 1.50 | 1.86 |

The invention claimed is:

1. An actuator element, comprising:
a first electrode layer comprising a first gel film comprising carbon nanotubes, an ionic liquid and a polymer;
an ion-conductive layer comprising a second gel film comprising the ionic liquid and the polymer, formed on the first electrode; and
a second electrode layer comprising a third gel film comprising carbon nanotubes, the ionic liquid and the polymer, formed on the ion-conductive layer, the second electrode layer being insulated from the first electrode layer;
the actuator element being capable of being flexed or deformed by creating a potential difference between the electrode layers.

2. An actuator element according to claim 1, wherein the first electrode layer has a first surface having the ion-conductive layer formed thereon and a second surface, wherein the second electrode layer has a third surface having the ion-conductive layer formed thereon and a fourth surface, the actuator element further comprising:

a first conductive layer formed on the second surface, and a second conductive layer formed on the fourth surface.

3. An actuator element according to claim 1, wherein the polymer is at least one member selected from the group consisting of polyvinylidene fluoride/hexafluoropropylene copolymer, polyvinylidene fluoride, perfluorosulfonic acid, poly(2-hydroxyethyl methacrylate), polymethyl methacrylate, polyethylene oxide, and polyacrylonitrile.

4. An actuator element according to claim 2, wherein the polymer is at least one member selected from the group consisting of polyvinylidene fluoride/hexafluoropropylene copolymer, polyvinylidene fluoride, perfluorosulfonic acid, poly(2-hydroxyethyl methacrylate), polymethyl methacrylate, polyethylene oxide, and polyacrylonitrile.

5. An actuator element according to claim 1, wherein the actuator element is operated in air.

6. An actuator element according to claim 2, wherein the actuator element is operated in air.

7. A method for producing the actuator element, comprising:

forming a first electrode layer comprising a first gel film comprising carbon nanotubes, an ionic liquid and a polymer;

forming an ion-conductive layer comprising a second gel film comprising the ionic liquid and the polymer, formed on the first electrode; and forming a second electrode layer comprising a third gel film comprising carbon nanotubes, the ionic liquid and the polymer, formed on the ion-conductive layer, the second electrode layer being insulated from the first electrode layer;

wherein the first electrode layer, the ion-conductive layer and the second electrode layer are formed by casting, coating, printing, extrusion, or injection.

8. A method for producing the actuator element according to claim 7, wherein the first electrode layer has a first surface having the ion-conductive layer formed thereon and a second surface, wherein the second electrode layer has a third surface having the ion-conductive layer formed thereon and a fourth surface, the method further comprising:

forming a first conductive layer formed on the second surface, and forming a second conductive layer formed on the fourth surface, wherein the electrode layers and the ion-conductive layer are formed by casting, coating, printing, extrusion, or injection.

* * * * *